(12) United States Patent
Okushima

(10) Patent No.: US 7,843,008 B2
(45) Date of Patent: Nov. 30, 2010

(54) SEMICONDUCTOR DEVICE

(75) Inventor: Mototsugu Okushima, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 241 days.

(21) Appl. No.: 11/727,741

(22) Filed: Mar. 28, 2007

(65) Prior Publication Data
US 2007/0228476 A1    Oct. 4, 2007

(30) Foreign Application Priority Data
Mar. 29, 2006   (JP)   ............................. 2006-091555

(51) Int. Cl.
    *H01L 23/62* (2006.01)
(52) U.S. Cl. .................. 257/355; 257/368; 257/707; 257/E23.087; 257/E23.088
(58) Field of Classification Search ................ 257/528, 257/534, 629, 678, 635, 712
    See application file for complete search history.

(56) References Cited

U.S. PATENT DOCUMENTS

| | | | |
|---|---|---|---|
| 5,909,046 A | 6/1999 | Tanizaki et al. | |
| 6,407,445 B1 | 6/2002 | Vashchenko et al. | |
| 7,064,353 B2 | 6/2006 | Bhat | |
| 7,183,612 B2 * | 2/2007 | Okushima | 257/350 |
| 7,217,979 B2 | 5/2007 | Matsunaga et al. | |
| 7,495,288 B2 | 2/2009 | Matsunaga et al. | |
| 2005/0023692 A1 | 2/2005 | Matsunaga et al. | |
| 2005/0133839 A1 | 6/2005 | Okushima | |
| 2005/0236672 A1 * | 10/2005 | Kodama et al. | 257/355 |
| 2005/0274956 A1 * | 12/2005 | Bhat | 257/79 |
| 2007/0187830 A1 | 8/2007 | Matsunaga et al. | |

FOREIGN PATENT DOCUMENTS

| | | |
|---|---|---|
| CN | 1603378 | 5/2005 |
| JP | 7-273293 | 10/1995 |
| JP | 10-270640 | 10/1998 |
| JP | 2004-273834 | 9/2004 |

(Continued)

OTHER PUBLICATIONS

Japanese Patent Office issued a Japanese Office Action dated Jan. 26, 2010, Application No. 2006-091555.

(Continued)

*Primary Examiner*—Allan R Wilson
*Assistant Examiner*—Dale Page
(74) *Attorney, Agent, or Firm*—Young & Thompson

(57) ABSTRACT

A semiconductor device capable of dissipating heat, which has been produced in an ESD protection element, to the exterior of the device rapidly and efficiently includes an ESD protection element having a drain region, a source region and a gate electrode, and a thermal diffusion portion. The thermal diffusion portion, which has been formed on the drain region, has a metal layer electrically connected to a pad, and contacts connecting the drain region and metal layer. The metal layer has a first wiring trace extending along the gate electrode, and second wiring traces intersecting the first wiring trace perpendicularly. The contacts are connected to intersections between the first wiring trace and the second wiring traces. Heat that has been produced at a pn-junction of the ESD protection element and transferred through a contact is diffused simultaneously in three directions through the first wiring trace and second wiring trace in the metal layer and is released into the pad.

10 Claims, 6 Drawing Sheets

FOREIGN PATENT DOCUMENTS

| | | |
|---|---|---|
| JP | 2005-019452 | 1/2005 |
| JP | 2005-183661 | 7/2005 |
| JP | 2005-294691 | 10/2005 |
| JP | 2005-311134 | 11/2005 |
| JP | 2005-340849 | 12/2005 |

OTHER PUBLICATIONS

Chinese Patent Office issued a Chinese Office Action dated Nov. 20, 2009, Application No. 200710089055.4.

* cited by examiner

LOCATION OF GENERATED HEAT

US 7,843,008 B2

SEMICONDUCTOR DEVICE

FIELD OF THE INVENTION

This invention relates to a semiconductor device having an electrostatic discharge protection element for protecting an internal circuit from electrostatic discharge. More particularly, the invention relates to a semiconductor device equipped with an electrostatic protection element having a finely patterned diffusion layer or an electrostatic protection element in which heat is not readily dissipated in the substrate direction, e.g., an electrostatic protection element on an SOI (Silicon On Insulator) substrate.

BACKGROUND OF THE INVENTION

There are instances where an internal circuit of a semiconductor device is destroyed by electrostatic discharge (ESD) from the outside (from the human body or a machine, etc.). For example, in a MOS field-effect transistor (MOSFET, or Metal Oxide Semiconductor Field-Effect Transistor), a gate insulating film (an oxide film) is formed to be extremely thin owing to the fine patterning in recent semiconductor devices. As a consequence, the gate insulating film is readily destroyed by the voltage of ESD. Accordingly, an ESD protection element usually is provided between a pad and the internal circuit (the circuit to be protected) in order to prevent the destruction of the semiconductor device by ESD.

A known ESD protection element utilizes the operation of a MOSFET-based parasitic bipolar transistor (e.g., see Patent Documents 1 and 2). In such an ESD protection element, a drain region is connected to the circuit to be protected and a source region (and gate electrode) is connected to a ground region or to a power-source region. For example, if an ESD current flows from a pad into the drain region in an n-type MOSFET-based ESD protection element, a reverse bias develops and avalanche breakdown occurs. A current then flows from the drain region to the silicon substrate, and the current raises the potential of the channel region. As a result, when the voltage of the base region surpasses a prescribed voltage, the device operates as a parasitic bipolar transistor in which the drain region is the collector, the silicon substrate is the base and the source region is the emitter. An ESC current therefore flows between the drain and source and is allowed to escape into the ground region.

When an ESD current flows into an ESD protection element, heat is evolved at the pn junction, e.g., between the drain and channel regions. In the ESD protection elements described in Patent Documents 1 and 2, regions of thermal dissipation (heat sinks) are formed in order to prevent destruction due to the evolution of heat. In the ESD protection element described in Patent Document 1, the heat dissipating regions are formed in such a manner that they will not become the path of an ESD current. The heat dissipating regions are separated from one another along the width direction of gate electrodes. In the ESD protection element described in Patent Document 2, a floating heat sink in which a direct electrical connection to the heat sink is non-existent is formed in the vicinity of a pn junction.

[Patent Document 1]
Japanese Patent Kokai Publication No. JP-P2005-311134A
[Patent Document 2]
U.S. Pat. No. 6,407,445

SUMMARY OF THE DISCLOSURE

The disclosure of the above mentioned Patent Documents are herein incorporated by reference thereto.

The following analyses on the related art will be given by the present invention.

Owing to the fine patterning of recent semiconductor devices, the pn junction and diffusion region in an ESD protection element also are of diminished size. Consequently, the ESD protection element has such a structure that the heat generated by an ESD current readily concentrates in the pn junction. Further, an STI (Shallow Trench Isolation) region formed on the substrate limits the path of heat dissipation. This also produces conditions that tend to favor the confinement of heat. Recent ESD protection elements, therefore, are structured so that heat will not easily escape in the direction of the substrate. This is conspicuous in the structure of an SOI substrate or the like in which the substrate and insulator are completely isolated. Furthermore, in a case where copper wiring is employed in a semiconductor device, it is difficult to fabricate thick wiring because fine wiring is formed in a polishing step that relies upon CMP (Chemical Mechanical Polishing). For this reason, it is difficult to obtain a large heat dissipating effect from copper wiring. Recent ESD protection elements, therefore, have a structure that exhibits a poor heat dissipating property. If the dissipation of heat does not take place efficiently and overheating results, the ESD protection element, especially the pn junction, will undergo thermal destruction.

Accordingly, in the ESD protection elements of Patent Documents 1 and 2, the heat dissipating region (heat sink) is formed on the diffusion region (drain region). However, the heat dissipating region in Patent Documents 1 and 2 is in a floating state in which there is no electrical connection to a pad, etc. Such a heat dissipating region has a small thermal capacity and little ability to dissipate heat. Hence there is the danger that thermal protection of the pn junction will not be achieved in suitable fashion. If it is attempted to enlarge the thermal capacity of the heat dissipating region, this will make it necessary to enlarge the area and volume of the heat dissipating region. This in turn requires a large space for the heat dissipating region, a fact that is undesirable as far as semiconductor devices are concerned.

Further, if a contact into which an ESD current flows is formed at a position near the pn junction in an ESD protection element, the ESD current will flow locally through the pn junction in the vicinity of the contact. As a result, this portion of the element generates heat and the heat so evolved causes a further concentration of current. Consequently, an ESD protection element having such a structure tends to suffer thermal breakdown particularly at the pn junction in the vicinity of the contact.

FIGS. 9 to 11 are plan and sectional views of an ESD protection element in which a contact into which an ESD current flows has been formed at a position in the vicinity of a pn junction. FIG. 9 is a schematic plan view of the ESD protection element, FIG. 10 is a schematic sectional view taken along line C-C in FIG. 9, and FIG. 11 is a schematic plan view of an ESD protection element of a different form. If an ESD protection element 31 shown in FIGS. 9 to 11 is an n-type MOSFET, for example, an ESD current will flow into a drain region 33 through a metal layer 42 and contact 41, and the current will escape from a source region 35 into a ground region (not shown) through a contact 43 and metal layer 44. At this time heat is produced at a pn junction 39 (39a, 39b) between the drain region 33 and a channel region 34 and between the channel region 34 and the source region 35. The diffusion of heat within a substrate 32 is impeded by an STI region 38 formed in the substrate 32. The heat produced in the vicinity of the pn junction 39 therefore is conducted upward through the contacts 41, 43. The path of thermal diffusion in the conventional arrangements of FIGS. 9 and 11 will be described.

In the arrangement illustrated in FIG. 9, metal layers 42a, 42b and 42c are partitioned in a direction along which the pn junction 39 (gate electrode 36) extends (namely in the width direction of the gate electrode 36). By way of example, if local heating occurs at a pn junction 39a in the vicinity of the contact 41b connected to the metal layer 42b, the heat is conducted from the contact 41b to the metal layer 42b. At this time a conduction path for the heat that has propagated through the contact 41b exists only to the right of the drawing (in the direction of the arrow) where a vialess contact (not shown) that leads to a pad (not shown) has been formed; heat cannot be conducted in the directions of the metal layers 42a and 42c. Accordingly, the path of thermal conduction is limited to a single direction. The result is poor efficiency of thermal dissipation.

In the arrangement depicted in FIG. 11, metal layer 42 extends in the direction of the pn junction 39 (gate electrode 36), and the contacts 41a to 41d also are arrayed along the pn junction 39. For example, if local heating occurs at the pn junction 39a between contacts 41b and 41c, the heat is conducted from both contacts 41b and 41c to the metal layer 42. At this time the heat that has propagated through the contacts 41b and 41c appears to have conduction paths in each of two directions. For example, the heat that has propagated through the contact 41b appears to have conduction paths in the metal layer 42 in a total of two directions, namely in the direction of contact 41a and in the direction of contact 41c. However, since heat is not conducted in the direction of higher temperature, the heat that has propagated through the contact 41b can only be conducted in the single direction of contact 41a and the heat that has propagated through the contact 41c can only be conducted in the single direction of contact 41d. This means that the path of thermal conduction is essentially limited to one direction in the arrangement of FIG. 11 as well.

Accordingly, since the ESD protection element in recent semiconductor devices has a structure in which it is difficult for heat to dissipate, it is necessary to assure an efficient and reliable heat dissipating path in semiconductor devices.

In accordance with a first aspect of the present invention, there is provided a semiconductor device equipped with an electrostatic discharge protection element having first and second semiconductor regions that form a first pn junction, the device having a first metal layer formed above the electrostatic discharge protection element and a plurality of first contacts connecting the first semiconductor region and the first metal layer; the first metal layer and the first contacts being in a thermally non-floating state; the first metal layer having a first diffusion path whereby heat that has been conducted through at least one first contact among the plurality thereof is diffused simultaneously from a connection to the at least one first contact in at least one direction of directions in which the first pn junction extends and in at least one direction of directions that intersect the directions in which the first pn junction extends; the first diffusion path forming part of a path that conducts heat to the exterior of the semiconductor device.

In the present invention, the expression "a thermally non-floating state" means a state in which heat can be conducted to the exterior of the semiconductor device through metal (inclusive of silicide). This means that heat can be conducted directly to a pad through a contact, metal layer or via, etc., by way of example.

In a second aspect, the first metal layer has at least one first wiring trace extending in a direction along which the first pn junction extends, and a plurality of second wiring traces that intersect the first wiring trace; and the first contacts are connected to intersections between the first wiring trace and the second wiring traces.

In a third aspect, the first metal layer is electrically connected to a pad; and the first metal layer and the first contacts define a path of conduction of electrostatic discharge current.

In a fourth aspect, the first semiconductor region has a silicide layer on a surface portion thereof; and the first contacts are connected to the silicide layer.

In a fifth aspect, the electrostatic discharge protection element further has a third semiconductor region that together with the second semiconductor region forms a second pn junction; and the third semiconductor region is electrically connected to a ground region or power-source region.

In a sixth aspect, the semiconductor device comprises: a second metal layer formed above the electrostatic discharge protection element; and a plurality of second contacts connecting the third semiconductor region and the second metal layer; wherein the second metal layer and the second contacts are in a thermally non-floating state; the second metal layer has a second diffusion path whereby heat that has been conducted through at least one second contact among the plurality thereof is diffused simultaneously from a connection to the at least one second contact in at least one direction of directions in which the second pn junction extends and in at least one direction of directions that intersect the directions in which the second pn junction extends; and the second diffusion path forms part of a path that conducts heat to the exterior of the semiconductor device.

In a seventh aspect, the second metal layer has at least one third wiring trace extending in a direction along which the second pn junction extends, and a plurality of fourth wiring traces that intersect the third wiring trace; and the second contacts are connected to intersections between the third wiring trace and the fourth wiring traces.

In a eighth aspect, the second metal layer is electrically connected to a pad; and the second metal layer and the second contacts define a path of conduction of electrostatic discharge current.

In a ninth aspect, the third semiconductor region has a silicide layer on a surface portion thereof; and the second contacts are connected to the silicide layer.

In a tenth aspect, the first semiconductor region is a drain region, the second semiconductor region is a channel region, the third semiconductor region is a source region, and the electrostatic discharge protection element has a metal oxide semiconductor field-effect transistor structure that further includes a gate insulating film and a gate electrode on the second semiconductor region.

The meritorious effects of the present invention are summarized as follows.

In the semiconductor device according to the present invention, the diffusion path is such that heat generated by ESD current is diffused in a direction in which the pn junction extends and in a direction that intersects, and preferably is perpendicular to, this direction. As a result, heat that has been generated in the ESD protection element can be diffused over a wide area in a short period of time. Furthermore, the diffusion path is electrically connected to the exterior of the semiconductor device. As a result, the heat diffused can be released to the exterior of the semiconductor device rapidly without residing at the location where the heat was produced.

In accordance with the present invention, therefore, heat generated by ESD current can be dissipated efficiently regardless of the location at which the heat is generated, and a more reliable path of thermal dissipation can be realized. In other words, according to the present invention, the heat resistance of an ESD protection element can be enhanced.

Other features and advantages of the present invention will be apparent from the following description taken in conjunction with the accompanying drawings, in which like reference characters designate the same or similar parts throughout the figures thereof.

PREFERRED MODES OF THE INVENTION

Figure 1:
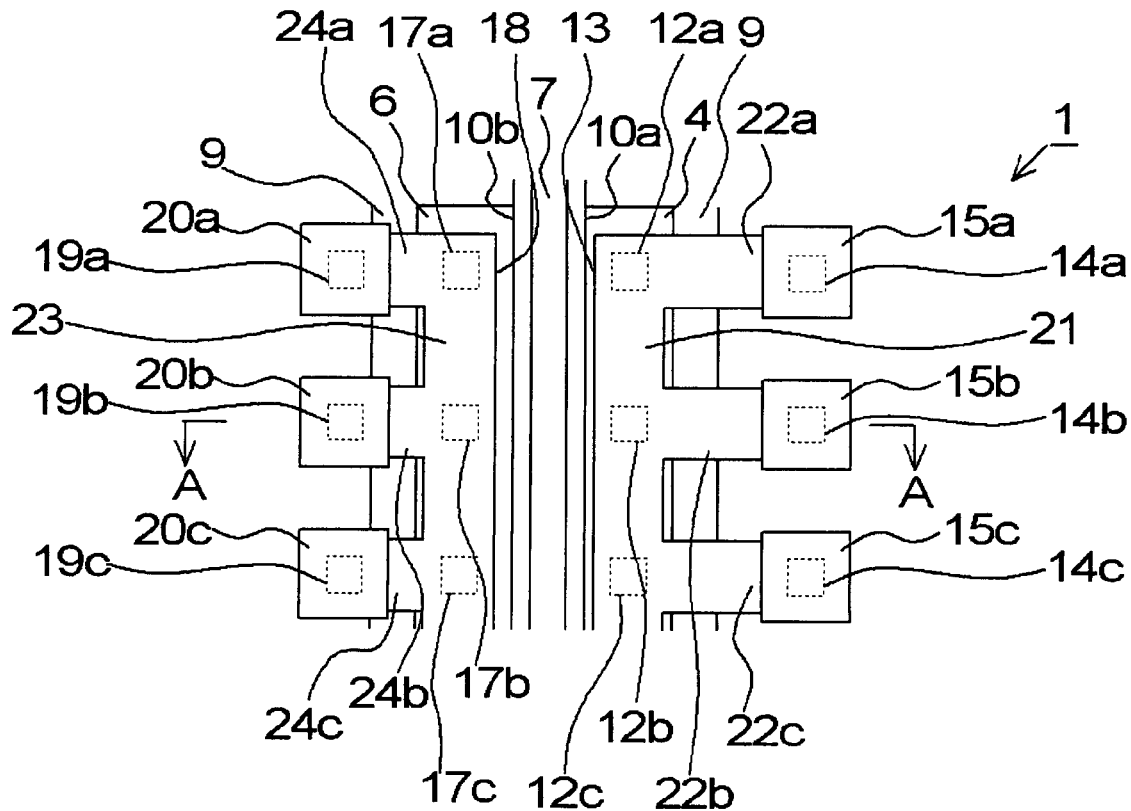
FIG. 1 is a schematic plan view of a semiconductor device according to a first example of the present invention.
Figure 2:
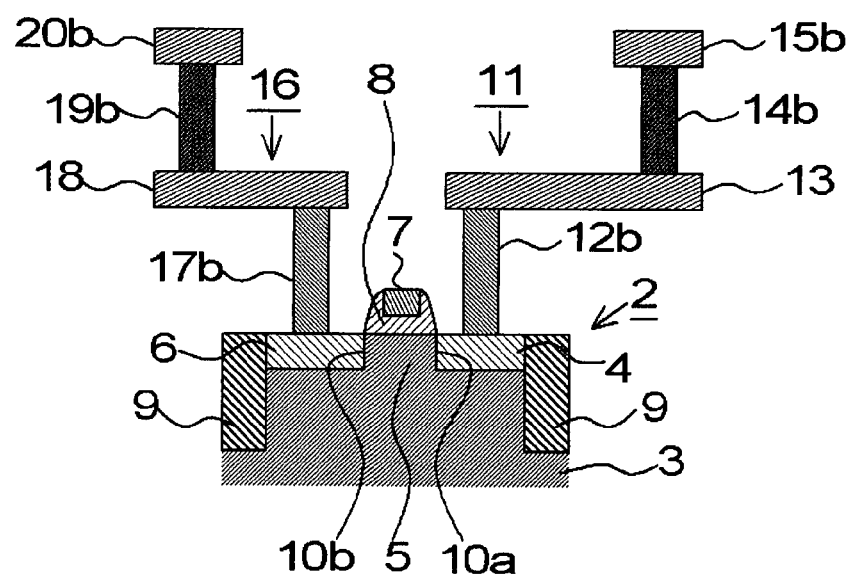
FIG. 2 is a schematic sectional view taken along line A-A of FIG. 1.

A semiconductor device according to a first example of the present invention will be described first. FIG. 1 is a schematic plan view of a semiconductor device according to a first example of the present invention. Further, FIG. 2 is a schematic sectional view taken along line A-A of FIG. 1. A semiconductor device 1 according to the present invention has an ESD protection element 2 and thermal diffusion regions 11, 16 for conducting ESD current and heat. The ESD protection element 2 has pn junctions 10a, 10b and protects an internal circuit (a circuit to be protected) (not shown) from the ESD current.

The ESD protection element 2 of the semiconductor device 1 according to the first example is a MOSFET-based ESD protection element. The ESD protection element 2 has a drain region 4 serving as a first semiconductor region formed in a well 3; a channel region 5 serving as a second semiconductor region; a source region 6 serving as a third semiconductor region; and a gate electrode 7 and gate insulating film 8 (illustrated as an integral part of the side wall) formed on the channel region 5. A silicide layer (not shown) preferably is formed on the surface portions of the drain region 4, source region 6 and gate electrode 7. The MOSFET-based ESD protection element 2 (the semiconductor regions 4, 5, 6, gate electrode 7 and silicide layer, etc.), an STI region 9, contacts 12, 17, metal layers 13, 15, 18, 20 and vias 14, 19, etc., can be fabricated using a well-known method. It should be noted that insulating films between the layers are not shown in the drawings.

A first thermal diffusion portion 11 is formed on the drain region 4 and has first contacts 12 and a first metal layer 13. The first contacts 12 connect the drain region 4 and the first metal layer 13. If the drain region 4 has a silicide layer, then it is preferred that the first contacts 12 be connected to the silicide layer. The first metal layer 13 is formed above the ESD protection element 2 (drain region 4) and has at least one first wiring trace 21 and a plurality of second wiring traces 22. The first wiring trace 21 extends in a direction along which the pn junction 10a, which is formed by the drain region 4 and channel region 5, extends (namely in a direction along which the gate electrode 7 extends). Each second wiring trace 22 extends so as to intersect (join) the first wiring trace 21. The direction in which each second wiring trace 22 extends preferably is a direction in which ESD current flows into the channel region 5 from the drain region 4, and more preferably is a direction perpendicular to the direction in which the first pn junction 10a extends. The first contacts 12 are arrayed along the direction in which the first pn junction 10a (gate electrode 7) extends and are connected to the intersections between the first wiring trace 21 and the second wiring traces 22 of the first metal layer 13. As a result, the first wiring trace 21 and second wiring traces 22 form part of a first diffusion path for conducting heat to the exterior of the semiconductor device.

A second thermal diffusion portion 16 is formed on the source region 6 and has second contacts 17 and a second metal layer 18. The second contacts 17 connect the source region 6 and the second metal layer 18. If the source region 6 has a silicide layer, then it is preferred that the second contacts 17 be connected to the silicide layer. The second metal layer 18 is formed above the ESD protection element 2 (source region 6) and has at least one third wiring trace 23 and a plurality of fourth wiring traces 24. The third wiring trace 23 extends in a direction along which the pn junction lob, which is formed by the source region 6 and channel region 5, extends (namely in a direction along which the gate electrode 7 extends). Each fourth wiring trace 24 extends so as to intersect (join) the third wiring trace 23. The direction in which each fourth wiring trace 24 extends preferably is a direction in which ESD current flows into the source region 6 from the channel region 5, and more preferably is a direction perpendicular to the direction in which the pn junction 10b extends. The second contacts 17 are arrayed along the direction in which the pn junction 10b (gate electrode 7) extends and are connected to the intersections between the third wiring trace 23 and the fourth wiring traces 24 of the second metal layer 18. As a result, the third wiring trace 23 and fourth wiring traces 24 form part of a second diffusion path for conducting heat to the exterior of the semiconductor device.

The first thermal diffusion portion 11 and the second thermal diffusion portion 16 are not in a thermally floating state. In the first thermal diffusion portion 11, it is preferred that the connection be made to a pad (not shown) through via 14 and metal layer 15. Alternatively, the metal layer 15 may serve as a pad. Furthermore, the pad preferably is a conduction path of ESD current. As a result, the first thermal diffusion portion 11 (the first contacts 12 and first metal layer 13) serves as a path for conduction of ESD current. The pad may be a power-source pad, an input pad or an output pad. In the second thermal diffusion portion 16, it is preferred that the electrical connection be made to a ground region or power-source region through via 19 and metal layer 20. Alternatively, the metal layer 20 may serve as the ground region or power-source region. As a result, the second thermal diffusion portion 16 (the second contacts 17 and first metal layer 18) serves as a path for conduction of ESD current.

The ESD protection element 2 may be either an n-type MOSFET or a p-type MOSFET. When an n-type MOSFET is used as the ESD protection element, the source region 6 is connected to the ground region. When a p-type MOSFET is used as the ESD protection element, on the other hand, the source region 6 is connected to the power supply region.

Figure 3A:
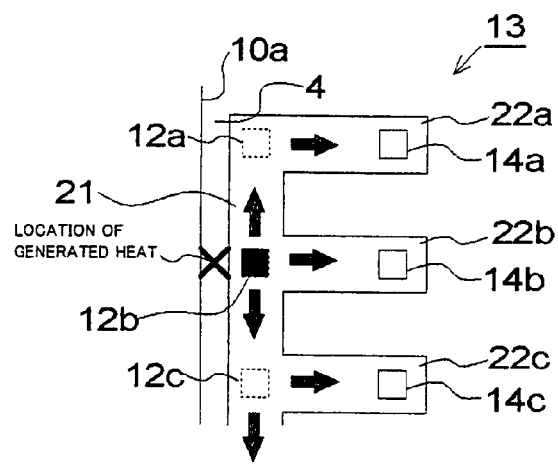
FIGS. 3A and 3B are enlarged views of a metal layer shown in FIG. 1.
Figure 3B:
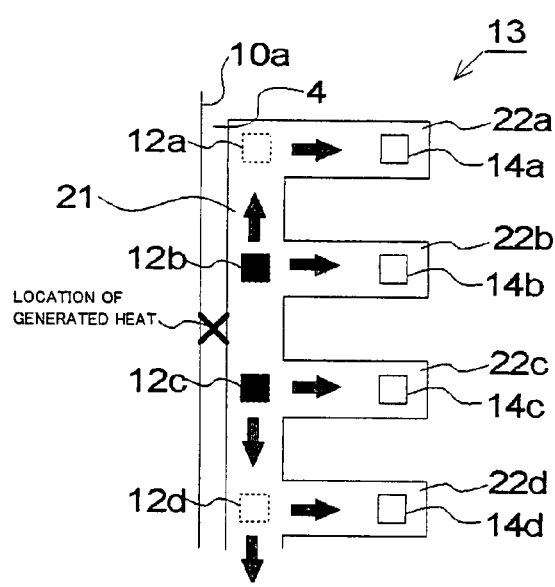

The heat dissipating path of the semiconductor device according to the invention will be described next. If the ESD protection element 2 is an n-type MOSFET, ESC current escapes into the ground region via the metal layer 15, via 14, first metal layer 13, first contact 12, drain region 4, channel region 5, source region 6, second contact 17, second metal layer 18, via 19 and metal layer 20. At this time heat is generated at the first pn junction 10*a* formed by the drain region 4 and channel region 5 and at the pn junction 10*b* formed by the channel region 5 and source region 6. In particular, in a case where application of positive in which a discharge occurs in the snap-back mode of the n-type MOSFET is taken into consideration, a reverse bias develops on the side of the drain region 4 and a large potential difference is produced. Consequently, a large amount of heat is produced at the first pn junction 10*a*, which is on the input side. In accordance with the arrangement illustrated in FIGS. 1 and 2, the heat generated at the first pn junction 10*a* is conducted from the drain region 4 to the first thermal diffusion portion 11. FIGS. 3A and 3B are partially enlarged views of the first metal layer 13. By way of example, if heat is produced locally at the first pn junction 10*a* in the vicinity of first contact 12*b*, as marked by "X" in FIG. 3A, then the heat is conducted primarily to the first metal layer 13 through the first contact 12*b*. Since the first contact 12*b* is joined to the intersection between the first wiring trace 21 and the second wiring trace 22, the heat that has been transferred through the first contact 12*b* passes through the first metal layer 13 and can be conducted simultaneously from the intersection in three directions (namely the direction of first contact 12*a*, the direction of via 14*b* and the direction of first contact 12*c*). The heat that has been conducted through the first wiring trace 21 in the direction of first contact 12*a* is conducted in the direction of via 14*a* through second wiring trace 22*a*. Similarly, the heat that has been conducted to the first contact 12*c* through the first wiring trace 21 is conducted in the direction of via 14*c* through second wiring trace 22*c* and in the direction opposite the first contact 12*b* through the first wiring trace 21. Thus, the heat that has been conducted to each via 14 is conducted further to the metal layer 15 of the upper layer and to the pad (not shown).

Further, by way of example, if heat is produced locally at the first pn junction 10*a* between the first contacts 12*b* and 12*c*, as marked by "X" in FIG. 3B, then the heat is conducted to the first metal layer 13 through both first contacts 12*b* and 12*c*. At this time the heat cannot be conducted to the location of higher temperature. Accordingly, the heat that has been conducted through the first contact 12*b* cannot be conducted toward the first contact 12*c*. Similarly, the heat that has been conducted through the first contact 12*c* cannot be conducted in the direction of first contact 12*b*. In this example, however, the heat that has been conducted through the first contact 12*b* can be conducted in two directions, namely in the directions of the first contact 12*a* and via 14*b*. Similarly, the heat that has been conducted through the first contact 12*c* can be conducted in two directions, namely in the directions of the via 14*c* and first contact 12*d*.

Thus, in accordance with the semiconductor device of the first example, even heat that has been generated locally in the vicinity of a contact in the conduction path of ESD current passes through paths in a total of three directions, namely in the two directions along which the pn junctions extend and in one direction that is perpendicular to these directions. As a result, the heat can be diffused rapidly. Furthermore, the first thermal diffusion portion 11 is not in a thermally floating state. That is, since the first thermal diffusion portion 11 is electrically connected to a pad, for example, heat does not remain in the first thermal diffusion portion 11 and can be released directly to the exterior of the semiconductor device in a short period of time. This means that heat produced in the ESD protection element 2 can be dissipated efficiently.

Furthermore, in accordance with the semiconductor device according to the first example, diffusing paths both in the direction in which a pn junction extends and in the direction perpendicular thereto can be obtained regardless of the location at which heat is generated locally. This assures heat dissipating paths that are more reliable.

The foregoing has been described in particular with regard to a heat dissipating path that passes through the first thermal diffusion portion 11 for heat produced at the first pn junction 10*a*. However, the heat dissipating path that passes through the second thermal diffusion portion 16 for heat produced at the pn junction 10*b* is similar to that of the first thermal diffusion portion 11.

The semiconductor device according to the first example has a configuration in which the thermal diffusion portions 11 and 16 are provided on the first semiconductor region (drain region) 4 and third semiconductor region (source region) 6, respectively. However, a thermal diffusion portion can be formed solely on either one of these regions. For example, in the sectional view of FIG. 2, the thermal diffusion portion 11 can be formed only on the first semiconductor region 4 and ordinary contacts and metal wiring not having the arrangement of the present invention can be formed on the third semiconductor region 6. In a case where a thermal diffusion portion is formed only on one region, it is preferred that the thermal diffusion portion be formed on the pn-junction side where the amount of heat produced is large (the side of the first pn junction 10*a* in the case of an n-type MOSFET-based ESD protection element).

Further, in the first example, a configuration in which the first wiring trace 21 and third wiring trace 23 extend in parallel with the pn-junctions 10 is illustrated. However, if it is possible to connect the contacts 12 and to connect the contacts 17 arrayed along the pn-junctions 10 (the semiconductor regions 4 and 6, respectively), then the directions along which these wiring traces extend need not necessarily be parallel. Further, in the first example, a configuration in which the first wiring trace 21 and second wiring traces 22 (and the third wiring trace 23 and fourth wiring traces 24) intersect perpendicularly is illustrated. However, the angle at which the first wiring trace 21 and second wiring traces 22 (or the third wiring trace 23 and fourth wiring traces 24) are connected is not limited to a right angle; an angle that is most ideal can be selected.

Figure 4:
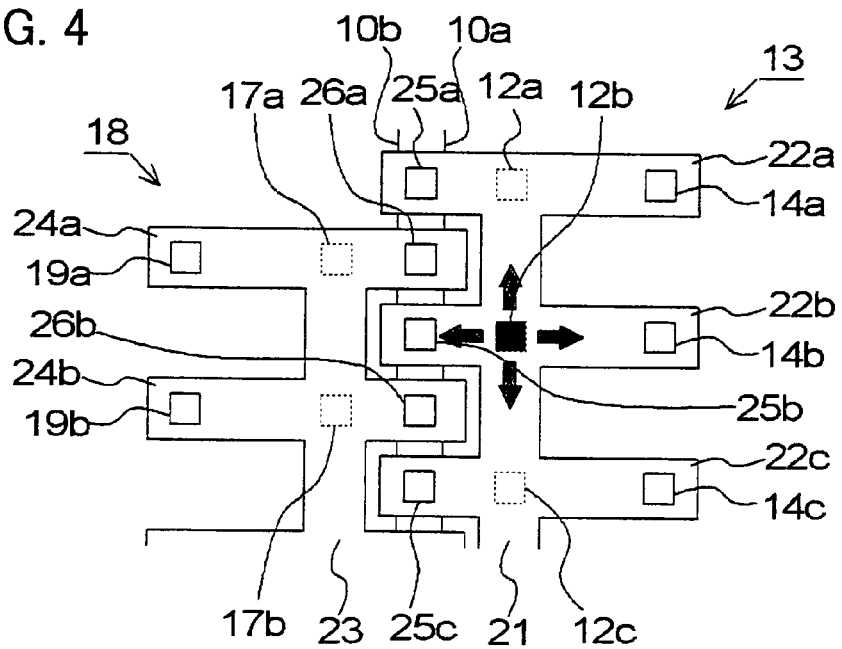
FIG. 4 is a schematic plan view of a semiconductor device according to a second example of the present invention.

A semiconductor device according to a second example of the present invention will now be described. FIG. 4 is a partial schematic view of the semiconductor device according to the second example. More specifically, FIG. 4 is a plan view of the first metal layer 13 of first thermal diffusion portion 11 and the second metal layer 18 of second thermal diffusion portion 16. In the first example, in the case of the first thermal diffusion portion 11, for example, the portion at which the first contact 12*b* and the first metal layer 13 are joined is such that the first wiring trace 21 and second wiring trace 22b intersect in a T-shaped configuration. In the second example, on the other hand, the first wiring trace 21 and second wiring traces 22 intersect in a cross-shaped configuration. That is, the second wiring traces 22 extend in a direction up to the third semiconductor region 6. Vias 14, 25 connected to the metal layer (not shown) of the upper layer are connected to respective ones of both ends of the second wiring traces 22. As a result, heat that has been transferred through the first contact 12b, for example, can be transferred in four directions in the first metal layer 13 (namely in the direction of first contact 12a, the direction of via 14b, the direction of first contact 12c and the direction of via 25). In accordance with the second example, therefore, diffusion paths can be obtained in a total of four directions, namely in the two directions along which the pn junctions 10 extend and in the two directions perpendicular to the directions in which the pn-junctions 10 extend. This makes it possible to diffuse heat more efficiently.

In the second example, the second metal layer 18 on the side of the third semiconductor region 6 has a configuration similar to that of the first metal layer 13. If the portions (to which the vias 25 are connected) of the second wiring traces 22 protruding from the first wiring trace 21 toward the side of the second metal layer 18 in the first metal layer 13 and the portions (to which the vias 26 are connected) of the fourth wiring traces 24 protruding from the third wiring trace 23 toward the side of the first metal layer 13 in the second metal layer 18 are arranged so as to fit together in interlocking fashion, as illustrated in FIG. 4, available space can be exploited without waste.

In the configuration illustrated in FIG. 4, the thermal diffusion portions (metal layers 13 and 18) are provided on the first semiconductor region 4 and third semiconductor region 6, respectively. In the second example also, however, a thermal diffusion portion can be formed solely on either one of these regions in a manner similar to the first example.

Figure 5:
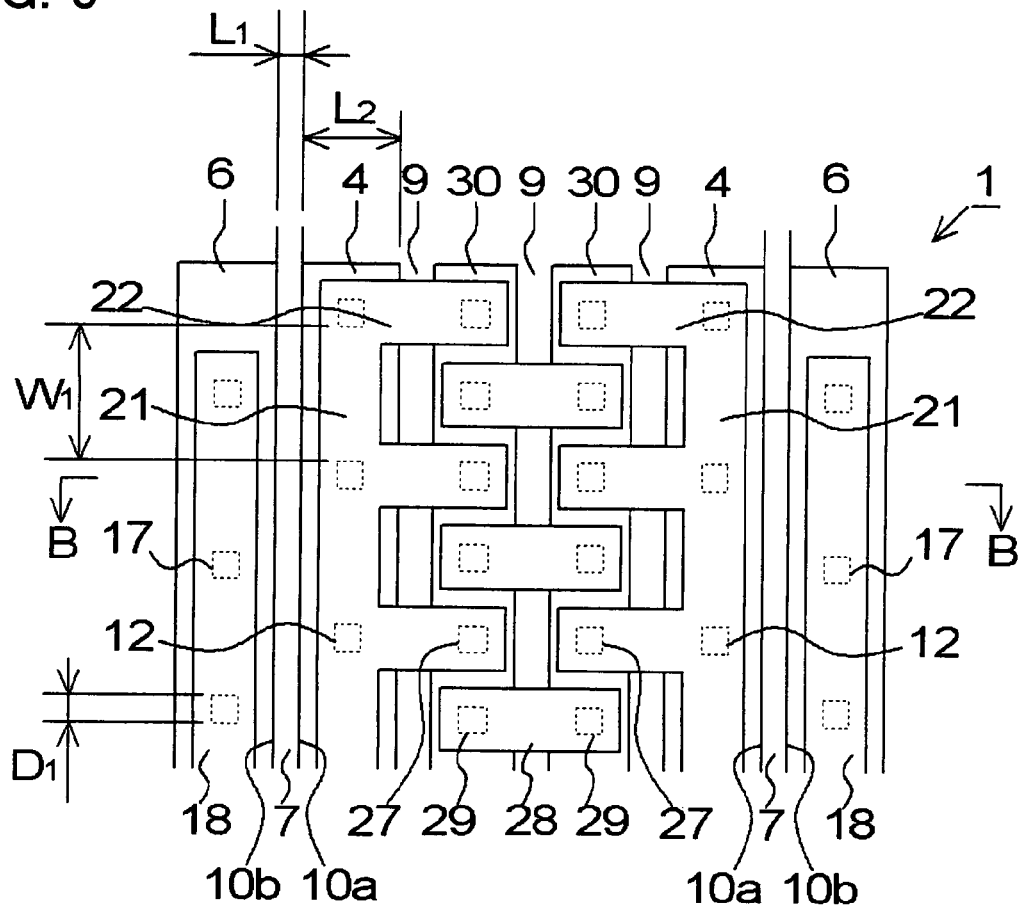
FIG. 5 is a schematic plan view of a semiconductor device according to a third example of the present invention.
Figure 6:
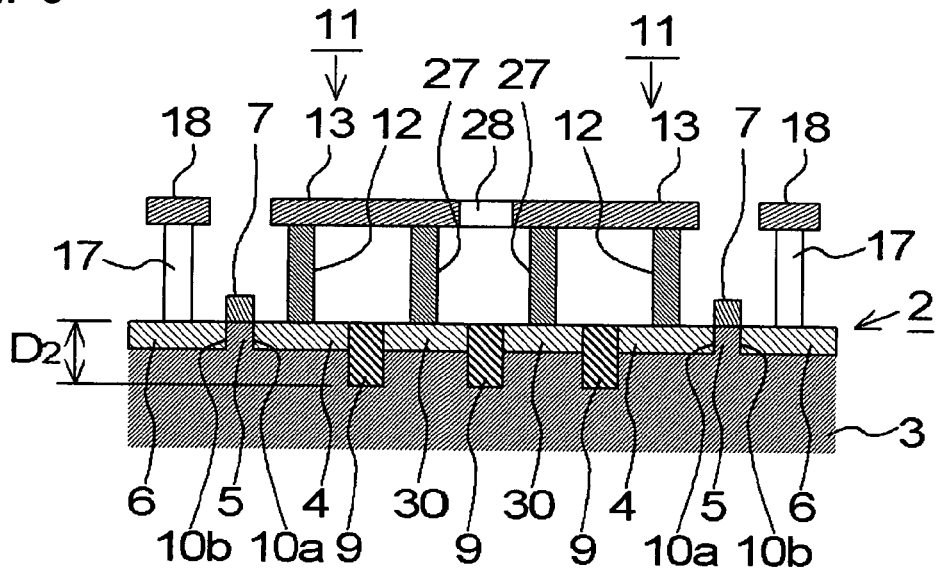
FIG. 6 is a schematic sectional view taken along line B-B of FIG.

A semiconductor device according to a third example of the present invention will now be described. The third example will be described with regard to the form of an array of MOSFET structures in a case where an ESD protection element has a plurality of MOSFET structures in a so-called multifinger array. FIG. 5 is a schematic plan view of two fingers of a semiconductor device according to the third example. FIG. 6 is a sectional view taken along line B-B of FIG. 5. It should be noted that gate insulating films are not shown in FIGS. 5 and 6. FIGS. 5 and 6 illustrate a pair of MOSFET structures in which drain regions 4 of the two MOSFET structures are arrayed so as to oppose each other. The ESD protection element 2 has diffusion regions 30 and insulating regions (STI regions) 9 between the two drain regions 4. The STI regions 9 are disposed between the drain regions 4 and the diffusion regions 30. Two of the diffusion regions 30 are formed between the STI regions 9 via a STI region 9. A silicide layer (not shown) is formed on the diffusion regions 30. Contacts 27 are connected to the silicide layer on the diffusion regions 30 and connect the diffusion regions 30 to the first metal layer 13 of the first thermal diffusion portion 11. Accordingly, each first thermal diffusion portion 11 formed on a drain region 4 bridges the drain region 4 and the diffusion region 30 by way of the first contacts 12, first metal layer 13 (second wiring traces 22) and contacts 27. Further, two diffusion regions 30 are bridged by two contacts 29 and third metal layer 28. The contacts 29 are connected to the silicide layer on the diffusion regions 30 and connect the diffusion regions 30 and third metal layer 28. The third metal layer 28 is connected to a pad (not shown) of the upper layer through a via (not shown). Further, the third metal layer 28 is placed between the second wiring traces 22 so as to alternate with the second wiring traces 22. It should be noted that the diffusion regions 30 are made to be of the same conductivity type as that of the drain regions 4. If the ESD protection element 2 has an n-type MOSFET structure, then the diffusion regions 30 are made n+ impurity regions.

The first thermal diffusion portion 11 at this time becomes connected to a pad via the diffusion region 30. The first thermal diffusion portion 11 is not in a thermally floating state. In other words, the heat produced in the ESD protection element 2 is capable of being transferred directly up to the pad through the first thermal diffusion portion 11 and silicide layer, etc.

The configuration of the first metal layer 13 of first thermal diffusion portion 11 is similar to that of the first example, and the first wiring trace 21 and second wiring traces 22 form T-shaped configurations (with the exception of the end portions of the first wiring trace 21). The first contacts 12 are connected to the intersections between the first wiring trace 21 and second wiring traces 22. In the first example, a thermal diffusion portion is formed on the source region 6 as well. In the third example illustrated in FIGS. 5 and 6, however, a thermal diffusion portion is not formed on the source region 6. However, a thermal diffusion portion may of course be formed also on the source region 6 in a manner similar to that of the first example. Further, a thermal diffusion portion can be put into the form illustrated in the second example. The second metal layer 18 on the source region 6 is electrically connected to a ground region or power-source region.

The conduction path of ESD current will be described next. In a case where the ESD protection element 2 has the structure of an n-type MOSFET, ESD current, when such current flows into a pad (not shown) connected to the third metal layer 28, is dispersed toward both contacts 29 in the third metal layer 28. The ESD current then flows into the drain region 4 through the diffusion region 30, contact 27, first metal layer 13 and first contact 12. At this time the diffusion region 30, drain region 4 and contacts 12, 27, 29 acts as a ballast resistance region for suppressing the concentration of current into each of the fingers.

The heat generated by ESD current in the ESD protection element 2 is conducted to the first metal layer 13 through the first contact 12. Accordingly, in a manner similar to that of the first example, the heat is diffused to the metal wiring traces 21, 22. The heat is then conducted up to the pad through the contact 27, diffusion region 30 (silicide layer), contact 29 and third metal layer 28, etc.

The third example is such that in a case where the ESD protection element 2 has a plurality of pairs of MOSFET structures of the kind shown in FIGS. 5 and 6, the plurality of pairs of MOSFET structures can be arrayed so as to share the source region 6 of each MOSFET structure. For example, an array can be adopted such that the gate electrode 7, drain region 4 and diffusion region 30 will be on the right side of the source region 6 on the right side in the configuration shown in FIGS. 5 and 6. Further, in the configuration shown in FIGS. 5 and 6, the diffusion region 30 between the drain regions 4 is separated into two regions by the STI region 9. However, the diffusion region 30 can be formed as a single region without forming the STI region 9.

The form of the array of the plurality of MOSFET structures and the configuration of the diffusion regions of the ESD protection element 2 can take on forms and configurations other than those described above. For example, the array of the plurality of MOSFET structures and the forms of the diffusion regions, contacts and metal layers, etc., described in the specification of Japanese Patent Kokai Publication No.

JP-P2005-183661A can be applied. Accordingly, the disclosure in the specification of Japanese Patent Kokai Publication No. JP-P2005-183661A is herein incorporated by reference thereto as an arrangement to which the semiconductor device of the present invention is applicable.

FIRST EXAMPLE

Figure 7A:
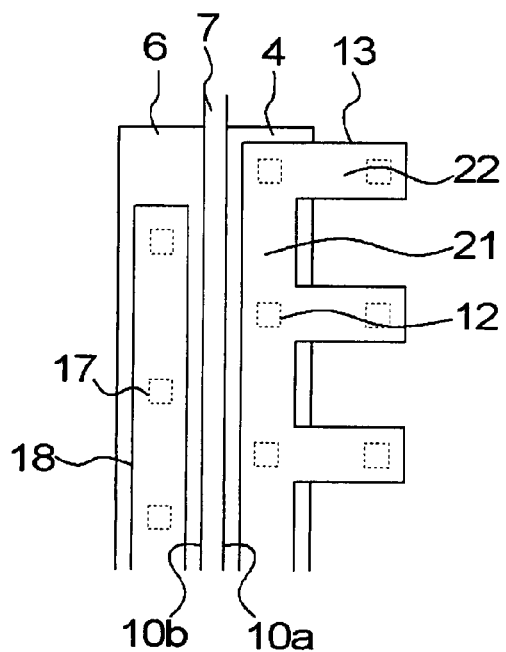
FIGS. 7A and 7B are schematic plan views illustrating a metal-layer portion of semiconductor devices used in a first example.
Figure 7B:
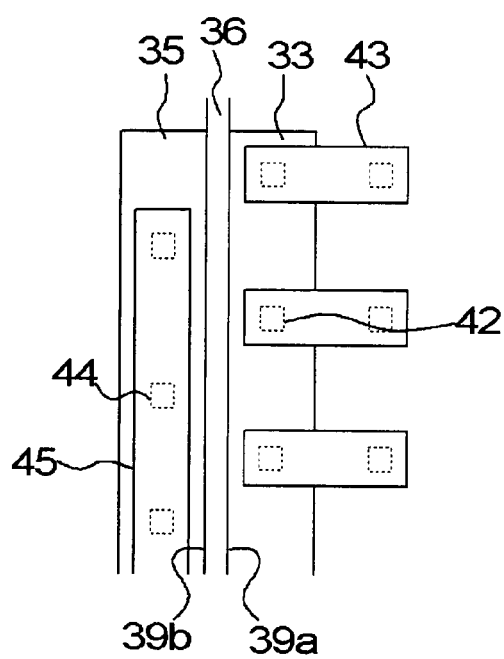
Figure 9:
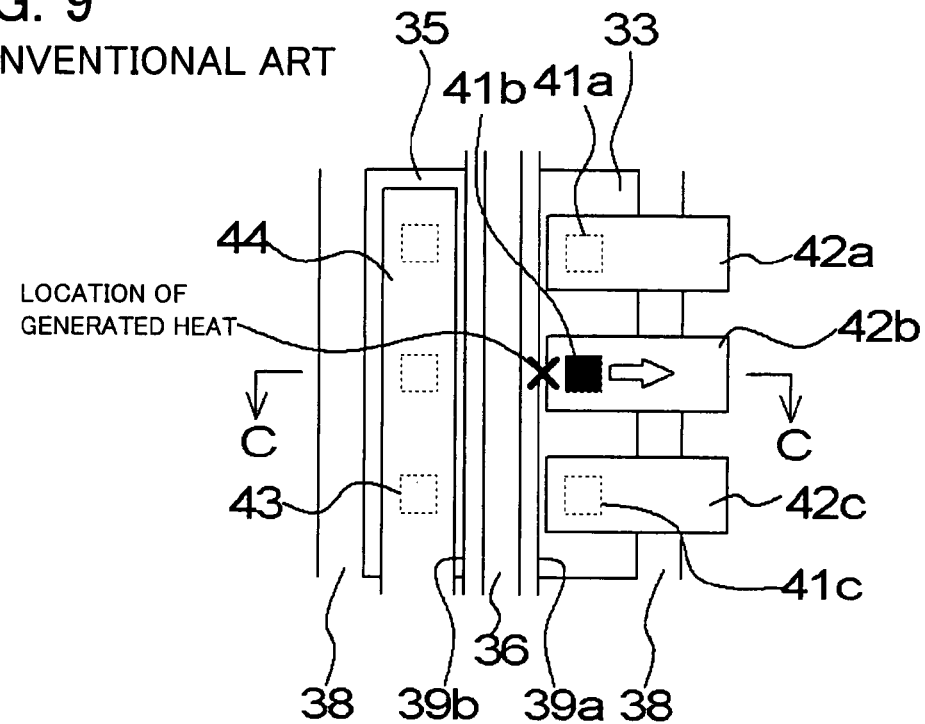
FIG. 9 is a schematic plan view of a semiconductor device useful in describing a problem to be solved by the present invention.
Figure 10:
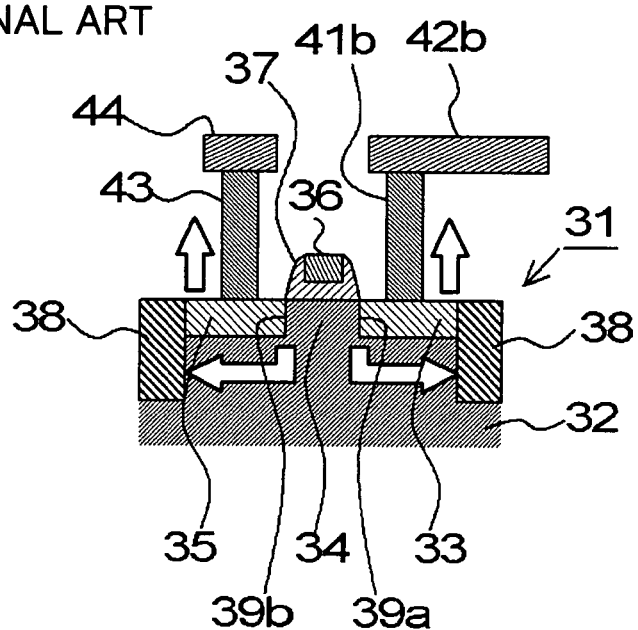
FIG. 10 is a schematic sectional view taken along line C-C of FIG. 9.
Figure 11:
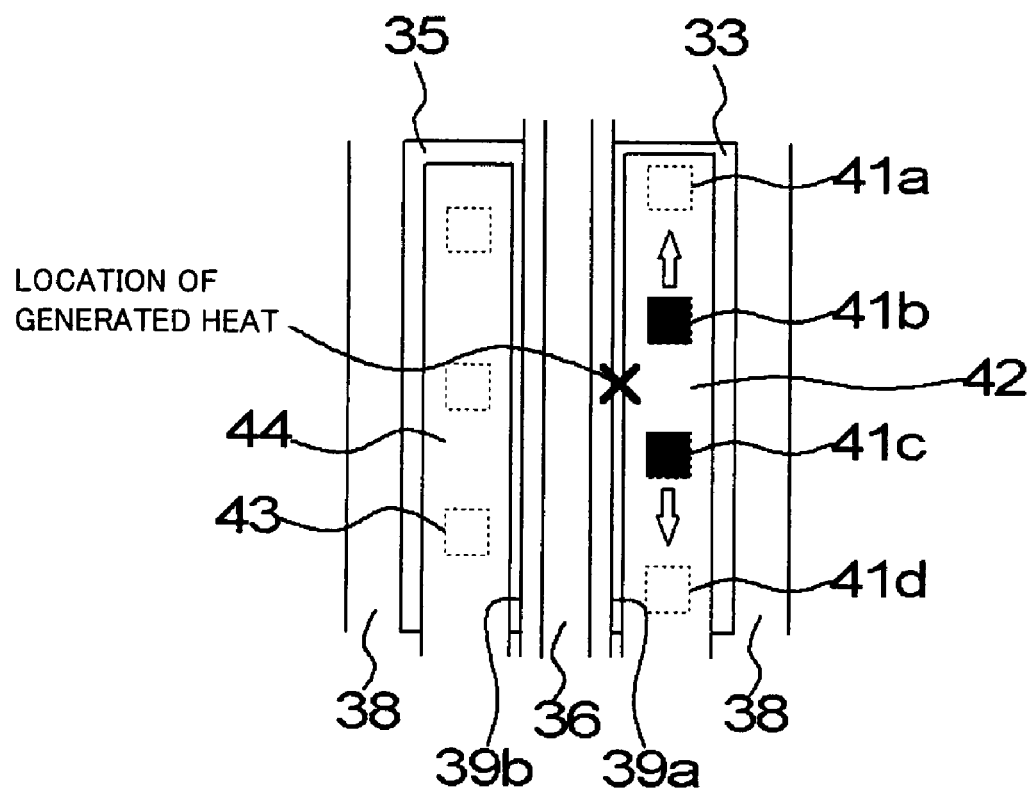
FIG. 11 is a schematic plan view of a semiconductor device useful in describing a problem to be solved by the present invention.

A test was conducted to confirm the heat dissipating effect of a thermal diffusion portion in the semiconductor device according to the present invention. Semiconductor devices A and B having an n-type MOSFET-based ESD protection element were used as the test pieces (and hence the semiconductor devices shall each be referred to as a "test piece"). FIGS. 7A and 7B are enlarged plan views of the metal-layer portions of the test pieces A and B, respectively. The test piece A shown in FIG. 7A illustrates a semiconductor device according to the present invention, and the test piece B shown in FIG. 7B illustrates a semiconductor device serving as an example for comparison. The thermal diffusion portion shown in FIG. 7A has a form similar to that of the semiconductor device according to the first example of the present invention. It should be noted that a thermal diffusion portion is not formed on the source region 6. The thermal diffusion portion shown in FIG. 7B has the form shown in FIG. 9. If compared with the test piece A shown in FIG. 7A, it will be understood that the thermal diffusion portion in FIG. 7B has the second wiring traces 22 only, i.e., that the second wiring traces 22 are not connected by a first wiring trace 21. The test pieces A and B are similar in other respects. The ESD protection element in each of test pieces A and B has a multifinger structure in which 20 fingers have been formed. The multifinger structure of test pieces A and B is similar to that of the arrangement shown in FIGS. 5 and 6. Each finger has a ballast resistance region of the kind shown in FIGS. 5 and 6. The test pieces A and B are semiconductor devices fabricated by the 90-nm generation rule. The primary dimensions of the ESD protection element in the test pieces A and B are as follows: Gate length L in FIGS. 5 and 7 is 60 nm, length L2 along the length direction of the gate of drain region 4 is 300 nm, diameter (length of one side of the square) of contacts 12, 17, 27, 29 of the semiconductor region is 90 nm, distance (along the width direction of the gate) W1 between contacts 12 on the drain region 4 is 600 nm, and depth D2 of the STI region 9 is 300 nm.

Figure 8:
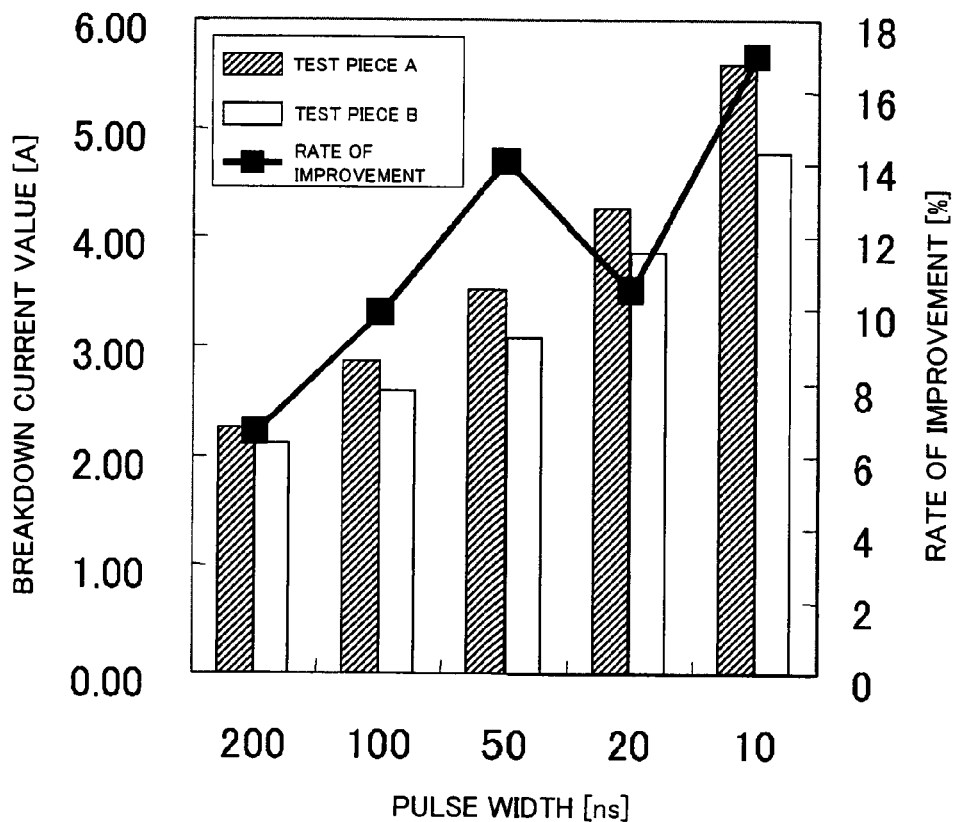
FIG. 8 is a diagram illustrating result of measurement in the first example.

The test method according to this example will be described. Pulses were applied to each of the test pieces A, B using TLP (Transmission Line Pulses) and the breakdown current value of each test piece was measured. There is a correlation between the breakdown current of an ESD protection element evaluated by the TLP method and the result of an ESD test [an international standard test such as HBM (Human Body Model)]. The TLP method is one used widely in evaluating ESD protection elements. The breakdown current value of each test piece was measured at the five pulse widths of 10 ns, 20 ns, 50 ns, 100 ns and 200 ns. FIG. 8 is a graph illustrating the relationship between pulse width and breakdown current value. FIG. 8 also illustrates a change in rate of improvement of the breakdown current value of test piece A. The rate of improvement was calculated based upon Equation 1 below.

rate of improvement [%]=(breakdown current value [A] of test piece A−breakdown current value [A] of test piece B)/breakdown current value [A] of test piece B×100   (1)

As illustrated in FIG. 8, test piece A according to the present invention afforded a breakdown current value higher than that of test piece B at every pulse width. It is believed that this result indicates an improvement in thermal breakdown durability, i.e., heat dissipating performance, of the ESD protection element owing to the present invention (i.e., the thermal diffusion portion).

In accordance with the result of measurement in FIG. 8, the rate of improvement of the test piece A rises as pulse width diminishes. This demonstrates that the smaller the pulse width, the greater the influence in the direction of the upper-layer wiring to which the metal layer (thermal diffusion portion) is connected, as compared with the substrate direction. That is, it will be understood that the present invention is effective in a CDM (Charged Device Model) in which the pulse width of ESD current is small.

In the foregoing examples, the present invention has been described using a semiconductor device having a MOSFET-based ESD protection element. However, the present invention is not limited to a MOSFET-based ESD protection element and can be applied to a semiconductor device having a diode-based ESD protection element, thyristor-based ESD protection element and bipolar-transistor-based ESD protection element. In other words, the present invention is applicable to a semiconductor device with an ESD protection element having a pn junction. Further, the form of the thermal diffusion portion (contacts and metal layer) also is not limited to that of the foregoing examples. It goes without saying that various modifications and improvements are possible within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device with an electrostatic discharge protection element having first and second semiconductor regions, which are formed within a substrate area electrically isolated by non-conductive regions extending into the substrate, that form a first pn junction, said device comprising:

a first metal layer formed above the electrostatic discharge protection element, the first metal layer being electrically connected to a pad at a position outside of the electrically isolated area; and a plurality of first contacts connecting the first semiconductor region and said first metal layer within the electrically isolated area;

wherein said first metal layer and said first contacts are in a thermally non-floating state;

said first metal layer has a first diffusion path whereby heat that has been conducted through at least one first contact among said plurality thereof is diffused simultaneously from a connection to said at least one first contact in a first direction in which the first pn junction extends and in a second direction intersecting the first direction; and said first diffusion path forms part of a path that conducts heat to the exterior of said semiconductor device.

2. The semiconductor device according to claim 1, wherein said first metal layer has at least one first wiring trace extending in the first direction, and a plurality of second wiring traces that intersect said first wiring trace; and said first contacts are connected to the intersection between said first wiring trace and said second wiring traces.

3. The semiconductor device according to claim 1, wherein said first metal layer and said first contacts define a path of conduction of electrostatic discharge current.

4. The semiconductor device according to claim 1, wherein said first semiconductor region has a silicide layer on a surface portion thereof; and said first contacts are connected to said silicide layer.

5. The semiconductor device according to claim 1, wherein the electrostatic discharge protection element further comprises a third semiconductor region that together with the second semiconductor region forms a second pn junction; and said third semiconductor region is electrically connected to a ground region or power-source region.

6. The semiconductor device according to claim 5, further comprising:
  a second metal layer formed above the electrostatic discharge protection element; and
  a plurality of second contacts connecting the third semiconductor region and said second metal layer within the electrically isolated area;
  wherein said second metal layer and said second contacts are in a thermally non-floating state;
  said second metal layer has a second diffusion path whereby heat that has been conducted through at least one second contact among said plurality thereof is diffused simultaneously from a connection to said at least one second contact in a third direction in which the second pn junction extends and in a fourth direction intersecting the third direction; and
  said second diffusion path forms part of a path that conducts heat to the exterior of said semiconductor device.

7. The semiconductor device according to claim 6, wherein said second metal layer has at least one third wiring trace extending in the third direction, and a plurality of fourth wiring traces that intersect said third wiring trace; and said second contacts are connected to intersections between said third wiring trace and said fourth wiring traces.

8. The semiconductor device according to claim 6, wherein said second metal layer is electrically connected to a pad; and said second metal layer and said second contacts define a path of conduction of electrostatic discharge current.

9. The semiconductor device according to claim 5, wherein said third semiconductor region has a silicide layer on a surface portion thereof; and said second contacts are connected to said silicide layer.

10. The semiconductor device according to claim 5, wherein said first semiconductor region is a drain region, said second semiconductor region is a channel region, said third semiconductor region is a source region, and said electrostatic discharge protection element has a metal oxide semiconductor field-effect transistor structure that further includes a gate insulating film and a gate electrode on said second semiconductor region.

* * * * *